US010374360B2

(12) United States Patent
Utz et al.

(10) Patent No.: US 10,374,360 B2
(45) Date of Patent: *Aug. 6, 2019

(54) CABLE RETENTION SYSTEM FOR POWER DISTRIBUTION UNIT

(71) Applicant: CHATSWORTH PRODUCTS, INC., Westlake Village, CA (US)

(72) Inventors: James Utz, Round Rock, TX (US); William Krietzman, Castle Rock, CO (US); Joshua Young, Austin, TX (US); Anderson Hungria, Pflugerville, TX (US)

(73) Assignee: Chatsworth Products, Inc., Agoura Hills, CA (US)

( * ) Notice: Subject to any disclaimer, the term of this patent is extended or adjusted under 35 U.S.C. 154(b) by 129 days.

This patent is subject to a terminal disclaimer.

(21) Appl. No.: 15/359,097

(22) Filed: Nov. 22, 2016

(65) Prior Publication Data

US 2017/0077649 A1 Mar. 16, 2017

Related U.S. Application Data

(63) Continuation of application No. 14/688,278, filed on Apr. 16, 2015, now Pat. No. 9,509,086, which is a
(Continued)

(51) Int. Cl.
*H01R 13/58* (2006.01)
*H01R 13/639* (2006.01)
(Continued)

(52) U.S. Cl.
CPC ..... *H01R 13/6395* (2013.01); *H01R 13/5812* (2013.01); *H01R 13/72* (2013.01); *H01R 25/006* (2013.01)

(58) Field of Classification Search
CPC ......................... H01R 13/6395; H01R 13/625; H01R 13/516; H01R 13/639; H01R 13/514;
(Continued)

(56) References Cited

U.S. PATENT DOCUMENTS

| | | | |
|---|---|---|---|
| 824,544 | A | 6/1906 | Hossege |
| 1,835,251 | A | 12/1931 | Wetstein |

(Continued)

FOREIGN PATENT DOCUMENTS

| | | | |
|---|---|---|---|
| CN | 106463887 | A | 2/2017 |
| EP | 646811 | A2 | 4/1995 |

(Continued)

OTHER PUBLICATIONS

Information Disclosure Statement (IDS) Letter Regarding Common Patent Application(s), dated Jan. 13, 2017.

(Continued)

*Primary Examiner* — Jean F Duverne
(74) *Attorney, Agent, or Firm* — Tillman Wright, PLLC; James D. Wright; David R. Higgins

(57) ABSTRACT

A cable retention system for a power distribution unit includes a tether and a tether mount. The tether has an elongate portion and an attachment portion, and the attachment portion includes a channel therein. The tether mount has a base at a proximal end and a head at a distal end. The base is adapted to attach the proximal end of the tether mount to the power distribution unit. The tether is adapted to be secured to the tether mount by snap-fitting the head of the tether mount into the channel of the attachment portion.

13 Claims, 8 Drawing Sheets

Related U.S. Application Data continuation of application No. 13/751,119, filed on Jan. 27, 2013, now Pat. No. 9,054,449.

(60) Provisional application No. 61/591,379, filed on Jan. 27, 2012.

(51) Int. Cl.
*H01R 13/72* (2006.01)
*H01R 25/00* (2006.01)

(58) Field of Classification Search
CPC H01R 13/5213; H01R 13/5812; H01R 13/72; H01R 25/006
USPC .......................................................... 439/471
See application file for complete search history.

(56) References Cited

U.S. PATENT DOCUMENTS 2,271,463 A 1/1942 Reeves
2,616,142 A 11/1952 Tinnerman
2,667,368 A 1/1954 Ferguson
3,054,025 A 9/1962 Edmunds
3,066,902 A 12/1962 Conil
3,088,054 A 4/1963 Meyer
3,202,788 A 8/1965 George
3,263,132 A 7/1966 Bangert, Jr.
3,295,905 A 1/1967 Sisk et al.
3,585,333 A 6/1971 Valle et al.
3,633,075 A 1/1972 Hawkins
3,910,671 A 10/1975 Townsend
4,004,197 A 1/1977 Hawkes, Jr.
4,015,397 A 4/1977 Flachbarth et al.
4,046,957 A 9/1977 Taylor et al.
4,101,233 A 7/1978 McConnell
4,524,937 A 6/1985 Zizan
4,531,800 A * 7/1985 Avener ................. H01R 13/625 439/147
4,675,900 A 6/1987 Temkin
4,699,289 A 10/1987 You
4,768,845 A 9/1988 Yeh
4,782,245 A 11/1988 Henry
5,011,427 A 4/1991 Martin
5,104,335 A 4/1992 Conley et al.
5,141,185 A 8/1992 Rumbold et al.
5,149,026 A 9/1992 Allen
5,158,476 A 10/1992 Kirby
5,216,579 A 6/1993 Basara et al.
5,295,041 A 3/1994 Metivier et al.
5,314,347 A 5/1994 Colleran et al.
5,326,934 A 7/1994 LeMaster et al.
5,338,211 A * 8/1994 Kodama .............. H01R 13/639 439/135
5,344,328 A 9/1994 Suggs
5,347,430 A 9/1994 Curlee et al.
5,370,553 A 12/1994 Zimmerman
5,381,315 A 1/1995 Hamaguchi et al.
5,391,084 A 2/1995 Krietzman
5,443,312 A 8/1995 Schluter
5,497,444 A 3/1996 Wheeler
5,535,771 A 7/1996 Purdy et al.
5,547,388 A 8/1996 Hill
5,568,362 A 10/1996 Hansson
D375,292 S 11/1996 D'Amato
5,595,494 A 1/1997 Wiebe
5,609,402 A 3/1997 Kemp
5,626,316 A 5/1997 Smigel et al.
5,640,482 A 6/1997 Barry et al.
5,752,682 A * 5/1998 Anderson ................ H02G 3/26 248/316.7
5,758,002 A 5/1998 Walters
5,788,087 A 8/1998 Orlando
5,911,661 A 6/1999 Murray et al.
5,921,795 A 7/1999 Weener et al.
5,921,806 A 7/1999 Shuey
5,961,081 A 10/1999 Rinderer
5,989,052 A * 11/1999 Fields .................. H01R 13/447 439/144
6,008,621 A 12/1999 Madison et al.
6,019,323 A 2/2000 Jette
6,047,838 A 4/2000 Rindoks et al.
6,105,218 A 8/2000 Reekie
6,127,631 A 10/2000 Green et al.
6,164,582 A 12/2000 Vara
6,170,784 B1 * 1/2001 MacDonald ......... H05K 7/1448 211/26
6,201,687 B1 3/2001 Murray
6,220,554 B1 4/2001 Daoud
6,220,880 B1 4/2001 Lee et al.
6,227,502 B1 5/2001 Derman
6,231,379 B1 5/2001 Shen
6,250,956 B1 6/2001 Pulizzi
6,259,604 B1 7/2001 Kuster
6,307,997 B1 10/2001 Walters et al.
6,315,580 B1 11/2001 Hurtubise et al.
6,318,680 B1 11/2001 Benedict et al.
6,326,547 B1 12/2001 Saxby et al.
6,327,139 B1 12/2001 Champion et al.
6,332,594 B2 12/2001 Shelton et al.
6,347,493 B1 2/2002 Jette
6,353,532 B1 3/2002 Landrum et al.
6,373,721 B2 4/2002 Lecinski et al.
6,403,885 B1 6/2002 Baker et al.
D462,056 S 8/2002 Chung
6,449,912 B2 9/2002 Jette
6,461,052 B1 10/2002 Hines et al.
6,481,678 B1 11/2002 Chong
6,494,411 B1 12/2002 Bjorklund
6,513,764 B2 2/2003 Koziol
6,541,705 B1 4/2003 McGrath
6,605,782 B1 8/2003 Krietzman et al.
6,614,665 B2 9/2003 Witty et al.
6,629,675 B1 10/2003 Bjorklund et al.
6,637,165 B2 10/2003 Jette
6,663,435 B2 12/2003 Lincoln et al.
6,672,896 B1 1/2004 Li
6,728,461 B1 4/2004 Senatore et al.
6,760,531 B1 7/2004 Solheid et al.
6,782,617 B2 8/2004 Pulizzi
6,884,942 B2 4/2005 McGrath et al.
6,937,461 B1 8/2005 Donahue, IV
6,981,893 B2 1/2006 Barker et al.
7,043,543 B2 5/2006 Ewing et al.
7,092,258 B2 8/2006 Hardt et al.
7,097,047 B2 8/2006 Lee et al.
7,141,891 B2 11/2006 McNally et al.
7,171,461 B2 1/2007 Ewing et al.
D549,650 S 8/2007 Russell et al.
7,268,998 B2 9/2007 Ewing et al.
7,312,980 B2 12/2007 Ewing et al.
D559,184 S 1/2008 Russell et al.
D562,766 S 2/2008 Yang
D564,964 S 3/2008 Caine et al.
7,345,241 B2 3/2008 Caveney et al.
7,352,947 B2 4/2008 Phung et al.
7,362,941 B2 4/2008 Rinderer et al.
7,365,964 B2 4/2008 Donahue, IV
D575,237 S 8/2008 Shiga et al.
D576,552 S 9/2008 Caine et al.
7,527,226 B2 5/2009 Kusuda et al.
7,540,749 B1 * 6/2009 Hall ..................... H01R 13/516 439/135
7,559,788 B2 * 7/2009 Legg .................. H01R 13/6395 439/371
7,567,430 B2 7/2009 Ewing et al.
7,637,771 B2 12/2009 Laursen
7,661,982 B2 2/2010 Tachi et al.
7,702,771 B2 4/2010 Ewing et al.
7,712,709 B2 5/2010 Winchester
7,777,365 B2 8/2010 Cleveland et al.
7,789,679 B2 9/2010 Wu et al.
D631,731 S 2/2011 Chen
7,891,993 B2 2/2011 Huber et al.

(56) References Cited

U.S. PATENT DOCUMENTS

| | | | | |
|---|---|---|---|---|
| 7,952,057 | B2 | 5/2011 | Grelck | |
| 7,974,105 | B2 | 7/2011 | Dean, Jr. et al. | |
| 8,025,525 | B2 * | 9/2011 | Krueger | H01R 13/5812 439/446 |
| 8,033,867 | B1 | 10/2011 | Kessler et al. | |
| 8,152,554 | B2 | 4/2012 | Chapel et al. | |
| D660,235 | S | 5/2012 | Liang-Hsu et al. | |
| 8,238,080 | B2 | 8/2012 | McGinn | |
| 8,263,867 | B2 | 9/2012 | Garza et al. | |
| D677,629 | S | 3/2013 | Corona | |
| D678,200 | S | 3/2013 | Corona | |
| D678,202 | S | 3/2013 | Corona | |
| 8,411,465 | B2 | 4/2013 | Dean, Jr. et al. | |
| 8,437,147 | B2 | 5/2013 | Dean, Jr. et al. | |
| D687,778 | S | 8/2013 | Utz | |
| 8,529,288 | B2 * | 9/2013 | Montena | H01R 13/5213 439/523 |
| 8,746,466 | B2 * | 6/2014 | Taylor | H04Q 1/06 211/26 |
| 8,757,560 | B2 | 6/2014 | Darnell | |
| 8,764,480 | B2 * | 7/2014 | Natoli | H01R 13/5213 439/523 |
| 8,882,536 | B2 | 11/2014 | Utz | |
| 9,054,449 | B2 * | 6/2015 | Utz | H01R 13/5812 |
| 9,106,003 | B2 * | 8/2015 | Anderson | H01R 13/5213 |
| 9,112,341 | B2 | 8/2015 | Eshima et al. | |
| 9,306,313 | B2 * | 4/2016 | Heggemann | H01R 13/514 |
| 9,509,086 | B2 * | 11/2016 | Utz | H01R 13/5812 |
| 9,531,126 | B2 | 12/2016 | Krietzman et al. | |
| 9,531,129 | B2 | 12/2016 | de Boer | |
| 9,548,597 | B2 | 1/2017 | Vacca et al. | |
| 9,844,143 | B2 | 12/2017 | Utz | |
| 10,187,995 | B2 | 1/2019 | Utz | |
| 2001/0002689 | A1 | 6/2001 | Shelton et al. | |
| 2001/0030266 | A1 | 10/2001 | MacDonald et al. | |
| 2002/0176681 | A1 | 11/2002 | Puetz et al. | |
| 2004/0077212 | A1 | 4/2004 | Pulizzi | |
| 2004/0146266 | A1 | 7/2004 | Solheid et al. | |
| 2005/0057912 | A1 | 3/2005 | Hardt et al. | |
| 2005/0259383 | A1 | 11/2005 | Ewing | |
| 2006/0118685 | A1 | 6/2006 | Schluter et al. | |
| 2006/0154503 | A1 | 7/2006 | Kidman | |
| 2008/0180917 | A1 | 7/2008 | Lawrence | |
| 2009/0038845 | A1 | 2/2009 | Fransen et al. | |
| 2009/0181577 | A1 | 7/2009 | Zahnen et al. | |
| 2009/0273915 | A1 | 11/2009 | Dean, Jr. et al. | |
| 2010/0193754 | A1 | 8/2010 | Garza et al. | |
| 2010/0200707 | A1 | 8/2010 | Garza et al. | |
| 2011/0056895 | A1 | 3/2011 | Tichy | |
| 2011/0211328 | A1 | 9/2011 | Dean, Jr. et al. | |
| 2011/0211329 | A1 | 9/2011 | Dean, Jr. et al. | |
| 2013/0196532 | A1 | 8/2013 | Utz et al. | |
| 2013/0196535 | A1 | 8/2013 | Utz | |
| 2013/0215581 | A1 | 8/2013 | Utz | |
| 2015/0222047 | A1 | 8/2015 | Utz et al. | |
| 2015/0357758 | A1 | 12/2015 | Krietzman et al. | |
| 2016/0211611 | A1 | 7/2016 | Cruz | |
| 2017/0042030 | A1 | 2/2017 | Utz | |
| 2017/0104294 | A1 | 4/2017 | Krietzman et al. | |
| 2018/0098429 | A1 | 4/2018 | Utz | |

FOREIGN PATENT DOCUMENTS

| | | | |
|---|---|---|---|
| JP | 2017-520887 | | 7/2017 |
| WO | 1999018580 | A2 | 4/1999 |
| WO | 2009089008 | A2 | 7/2009 |
| WO | 2015188116 | A1 | 12/2015 |

OTHER PUBLICATIONS

C14 Plug Lock, Tripp-Lite, http://www.tripplite.com/c14-plug-lock-insert-for-c13-outlets-blue~PLC13BL/, dated as of May 30, 2013, accessed Aug. 25, 2015 (4 pages).

Specification from WIREMOLD.com—Plug-In Outlet Center® Units—ED795R4, updated Mar. 2003 (8 pages).

Wikipedia entry for "IEC 60320," retrieved May 6, 2014 (11 pages).

"International Search Report" and "Written Opinion" of the International Search Authority (ISA/US) in Chatsworth Products, Inc., International Patent Application Serial No. PCT/US2015/034511, dated Sep. 15, 2015 (13 pages).

"Product Catalog" for Rack Technologies Pty Ltd, Internet Web Page <http://racktechnologies.com.au/files/rt2005.pdf>, Jun. 16, 2005, retrieved from Internet Archive Wayback Machine <http://web.archive.org/web/20050616212856/http://racktechnologies.com.au/files/rt2005.pdf> as reviewed as of Apr. 29, 2016 (73 pages).

"International Preliminary Report on Patentability" and "Written Opinion" of the International Search Authority (Isa/US) in Chatsworth Products, Inc., International Patent Application Serial No. PCT/US2015/034511, dated Dec. 6, 2016 (8 pages).

"International Preliminary Report on Patentability" of the International Search Authority (ISA/US) in Chatsworth Products, Inc., International Patent Application Serial No. PCT/US2016/064135, dated Jun. 19, 2018 (8 pages).

* cited by examiner

FIG. 3
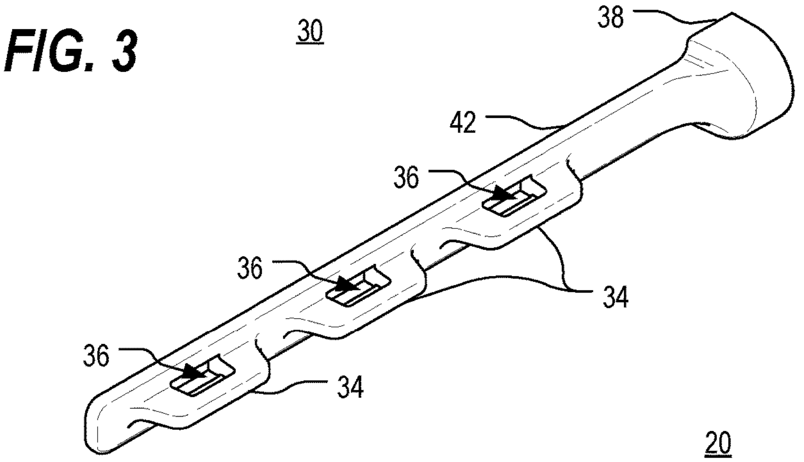
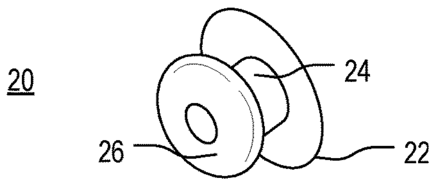
FIG. 4
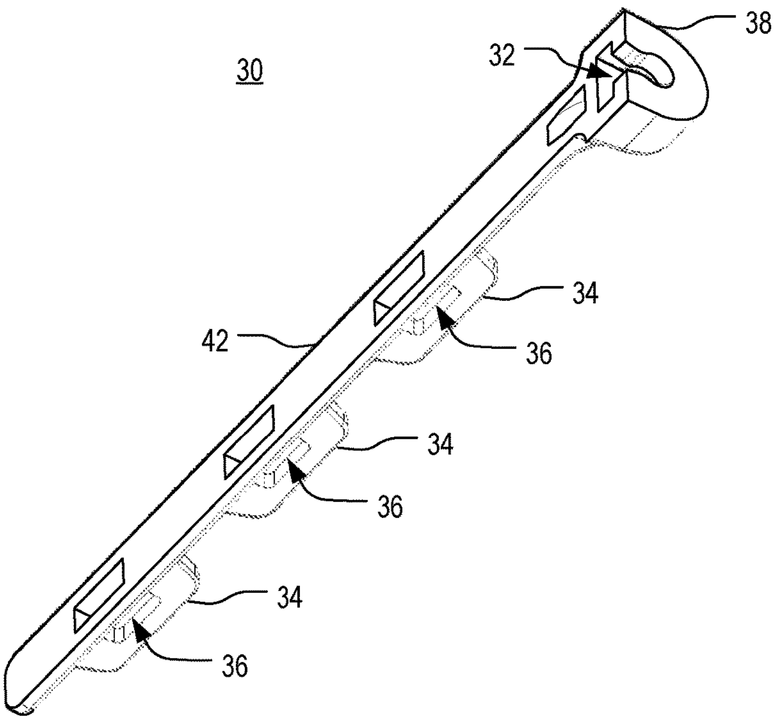
FIG. 5

CABLE RETENTION SYSTEM FOR POWER DISTRIBUTION UNIT

CROSS-REFERENCE TO RELATED APPLICATIONS

The present application is a U.S. continuation patent application of, and claims priority under 35 U.S.C. § 120 to, U.S. non-provisional patent application Ser. No. 14/688,278, filed Apr. 16, 2015, which '278 application published as U.S. Patent Application Publication No. US 2015/0222047 A1 on Aug. 6, 2015, which '278 application, the application publication thereof, and any patent issuing therefrom are each incorporated herein by reference in their entirety, and which '278 application is a U.S. continuation patent application of, and claims priority under 35 U.S.C. § 120 to, U.S. non-provisional patent application Ser. No. 13/751,119, filed Jan. 27, 2013, which '119 application published as U.S. Patent Application Publication No. US 2013/0196532 A1 on Aug. 1, 2013 and issued as U.S. Pat. No. 9,054,449 on Jun. 9, 2015, which '119 application, the application publication thereof, and the patent issuing therefrom are each incorporated herein by reference in their entirety, and which '119 application is a U.S. nonprovisional patent application of, and claims priority under 35 U.S.C. § 119(e) to, U.S. provisional patent application Ser. No. 61/591,379, filed Jan. 27, 2012, which '379 application is incorporated herein by reference in its entirety. Additionally, the entirety of each of the following commonly-assigned U.S. patent applications, and any application publication thereof, is expressly incorporated herein by reference:

(a) U.S. provisional patent application Ser. No. 61/591,342, filed Jan. 27, 2012 and entitled, "BOARD-MOUNTED CIRCUIT BREAKERS FOR ELECTRONIC EQUIPMENT ENCLOSURES;"

(b) U.S. provisional patent application Ser. No. 61/591,369, filed Jan. 27, 2012 and entitled, "POWER DISTRIBUTION UNIT WITH INTERCHANGEABLE RECEPTACLE TYPES;"

(c) U.S. non-provisional patent application Ser. No. 13/751,117, filed Jan. 27, 2013, and entitled, "BOARD-MOUNTED CIRCUIT BREAKERS FOR ELECTRONIC EQUIPMENT ENCLOSURES," which '117 application published as U.S. Patent Application Publication No. US 2013/0215581 A1 on Aug. 22, 2013; and (d) U.S. non-provisional patent application Ser. No. 13/751,118, filed Jan. 27, 2013, and entitled, "POWER DISTRIBUTION UNIT WITH INTERCHANGEABLE OUTLET ADAPTER TYPES," which '118 application published as U.S. Patent Application Publication No. US 2013/0196535 A1 on Aug. 1, 2013, and issued as U.S. Pat. No. 8,882,536 on Nov. 11, 2014.

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

Field of the Present Invention

The present invention relates generally to a cable retention system, and, in particular, to a cable retention system for use in connection with tool-less cord retention in power distribution units, particularly in electronic equipment enclosures and similar structures.

Background

Cabinets, including rack frame cabinets and other electronic equipment enclosures, are commonly used for storing equipment, often electrical equipment such as computer and telecommunications equipment with multiple components. It naturally follows that the multi-component electrical equipment being stored in cabinets requires multiple sources of power, and that power distribution units may be provided to facilitate this. As used herein, a "power distribution unit" shall be understood to mean a unitary or semi-unitary structure containing multiple power receptacles or outlets. In typical power distribution units (PDUs), the multiple receptacles or outlets are arranged in one or more rows or columns. The receptacles or outlets may be of different types, but are typically selected from conventional receptacle designs such as those set forward by International Electrotechnical Commission (IEC) 60320 standards.

To address the need for anchoring cables and cords that extend to and from the power distribution unit, various structures and mechanisms are known. For instance, rigid cable retention bars and permanently-attached cable retention clips can be used for such purposes. However, these existing mechanisms present drawbacks due to their typically large size and cumbersome nature. Cable retention bars and permanently-attached cable retention clips are known to obscure airflow channels in electronic equipment enclosures. Further, such structures restrict access to sites such as the rear areas of servers, storage locations and switch locations. Still further, anchor points for such structures often require a hole in the enclosure paneling or other enclosure structure in order to facilitate attachment of the structure to the enclosure (using fasteners or by snap-fitting into the hole).

Thus, a need exists for a cable retention system that overcomes the drawbacks associated with known mechanisms and structures. This, and other needs, is met by one or more aspects of the present invention.

SUMMARY OF THE PRESENT INVENTION

The present invention comprises a cable retention system. Broadly defined, the present invention according to a first aspect includes a cable retention system substantially as shown and described.

Broadly defined, the present invention according to a second aspect includes a cable retention system, for a power distribution unit, substantially as shown and described.

Broadly defined, the present invention according to a third aspect includes a method of retaining a cable at a power distribution unit, substantially as shown and described.

Broadly defined, the present invention according to a fourth aspect includes a cable retention system for a power distribution unit. The cable retention system includes a tether and a tether mount attached to the power distribution unit. The tether is adapted to be secured to the tether mount.

In features of this aspect, the tether may include an elongate portion and an attachment portion, the attachment portion including a channel extending therein; a head of the tether mount may be adapted to be snap-fit into the partially-open channel of the attachment portion, thereby securing the tether to the tether mount; and the elongate portion may include at least one tie wrap loop.

In another feature of this aspect, the tether may be composed of a plastic material.

In still another feature of this aspect, the tether may include an integrated tie wrap.

Broadly defined, the present invention according to a fifth aspect includes an accessory securement system for electronic equipment. The accessory securement system includes an accessory and an accessory mount, including a head, attached to the electronic equipment. The accessory is adapted to be secured to the accessory mount by snap-fitting to the head.

Broadly defined, the present invention according to a sixth aspect includes a cable retention system for a power distribution unit that has a tether and a tether mount. The tether has an elongate portion and an attachment portion, and the attachment portion includes a channel therein. The tether mount has a base at a proximal end and a head at a distal end. The base is adapted to attach the proximal end of the tether mount to the power distribution unit. The tether is adapted to be secured to the tether mount by snap-fitting the head of the tether mount into the channel of the attachment portion.

In features of this aspect, the elongate portion of the tether may include at least one loop that defines an aperture for receiving a tie wrap; the at least one loop may be a plurality of loops, each defining an aperture for receiving a tie wrap; the plurality of loops may include exactly three loops; the plurality of loops may include exactly four loops; and the least one loop may be a bridge lance.

In other features of this aspect, the head of the tether mount may be a boss; and the channel of the attachment portion may open toward one side of the attachment portion such that, when snap-fitted to the tether mount, the attachment portion nearly surrounds the head.

In other features of this aspect, the elongate portion may include a ridge extending along one side thereof, the ridge defining at least one aperture for receiving a tie wrap; and the at least one aperture may be a plurality of apertures.

In other features of this aspect, the elongate portion may define at least one aperture extending therethrough for receiving a tie wrap; and the at least one aperture may be a plurality of apertures.

In still other features of this aspect, the tether may be comprised of a plastic material; and the tether may include an integrated tie wrap.

Broadly defined, the present invention according to a seventh aspect includes an accessory securement system for electronic equipment that has an accessory and an accessory mount. The accessory has an attachment portion that includes a channel therein. The accessory mount has a base at a proximal end and a head at a distal end. The base is adapted to attach the proximal end of the accessory mount to the electronic equipment. The accessory is adapted to be secured to the accessory mount by snap-fitting the head of the accessory mount into the channel of the attachment portion.

In features of this aspect, the head of the accessory mount may be a boss; and the channel of the attachment portion may open toward one side of the attachment portion such that, when snap-fitted to the accessory mount, the attachment portion nearly surrounds the head.

Broadly defined, the present invention according to an eighth aspect includes a cable retention system for use in an electronic equipment enclosure. The cable retention system includes a power distribution unit, one or more tether mounts, and at least one tether. The one or more tether mounts each include a base at a proximal end and a head at a distal end, and each is attached at its base to the power distribution unit. The at least one tether has an elongate portion and an attachment portion, and the attachment portion includes a channel therein. The at least one tether is secured to a selected one of the one or more tether mounts by snap-fitting the head of the tether mount into the channel of the attachment portion.

In features of this aspect, the elongate portion of the at least one tether may include at least one loop that defines an aperture for receiving a tie wrap; and the at least one tether may be interchangeably attachable at any of the one or more tether mounts.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein:

FIG. 3 is a front isometric view of a tether of the cable retention system of FIG. 2;

FIG. 4 is a rear isometric view of a tether mount of the cable retention system of FIG. 2;

FIG. 5 is a rear perspective view of the tether of FIG. 3;

DETAILED DESCRIPTION

Figure 1:
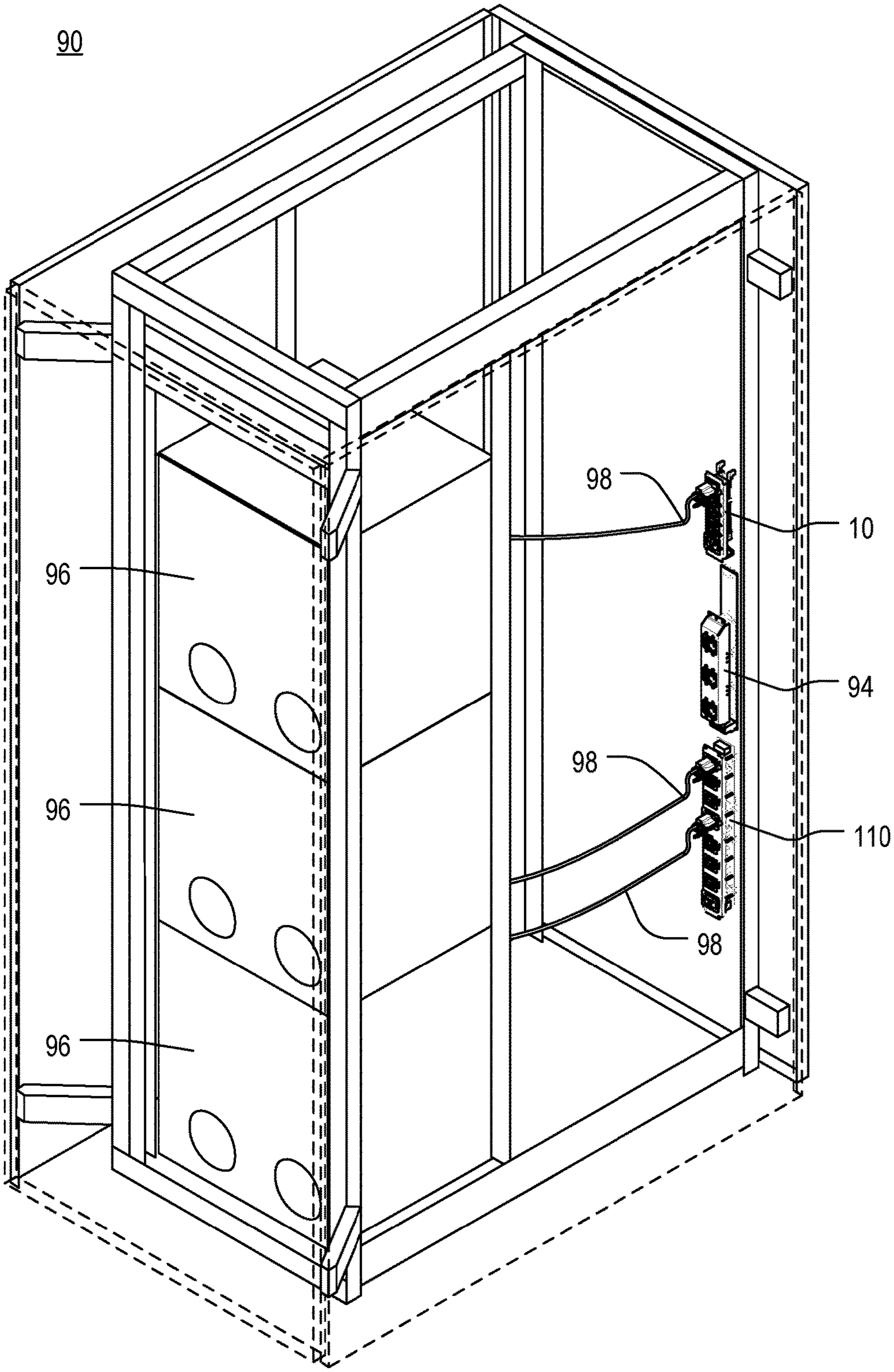
FIG. 1 is a partially schematic front isometric view of an electronic equipment enclosure having cable retention system-equipped power distribution units mounted therein in accordance with one or more preferred embodiments of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. As should be understood, any embodiment may incorporate only one or a plurality of the above-disclosed aspects of the invention and may further incorporate only one or a plurality of the above-disclosed features. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Regarding applicability of 35 U.S.C. § 112, ¶6, no claim element is intended to be read in accordance with this statutory provision unless the explicit phrase "means for" or "step for" is actually used in such claim element, whereupon this statutory provision is intended to apply in the interpretation of such claim element.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, one or more preferred embodiments of the present invention are next described. The following description of one or more preferred embodiment(s) is merely exemplary in nature and is in no way intended to limit the invention, its application, or uses.

FIG. 1 is a partially schematic front isometric view of an electronic equipment enclosure 90 having cable retention system-equipped power distribution units 10,110 mounted therein in accordance with one or more preferred embodiments of the present invention. The power distribution units 10,110 may be part of an electrical supply system that also includes such devices as other power distribution units and board-mounted circuit breaker assemblies 94. The electrical supply system has a general purpose of providing power, via power cables 98, to electronic equipment, such as servers 96, that is installed in the enclosure 90.

Figure 2:
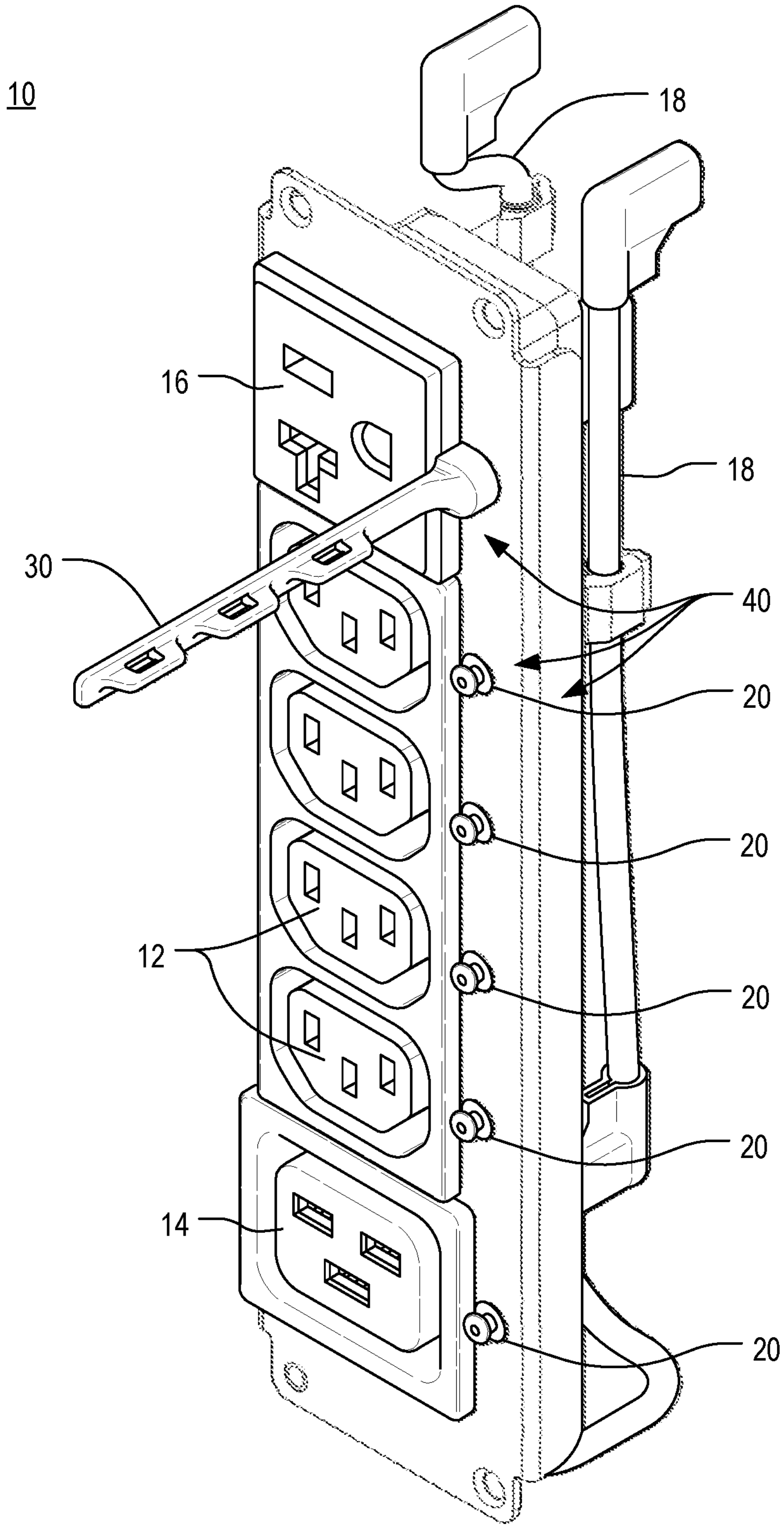
FIG. 2 is a front isometric view of an exemplary power distribution unit of FIG. 1 using a cable retention system in accordance with one or more preferred embodiments of the present invention.

FIG. 2 is a front isometric view of an exemplary power distribution unit (PDU) 10 of FIG. 1 using a cable retention system 40 in accordance with one or more preferred embodiments of the present invention. As shown in FIG. 2, the exemplary power distribution unit 10 includes a plurality of power receptacles or outlets 12,14,16. Additionally, cables 18 may be provided to facilitate the distribution of power to and from the PDU 10 at the rear thereof.

The receptacles in the PDU 10 illustrated in FIG. 2 are arranged in a vertical column, but it will be appreciated that receptacles may likewise be arranged in a horizontal row. A wide variety of differently-sized outlets may be arranged in the power distribution unit. In the embodiment depicted in FIG. 2, one outlet 16 is a conventional household outlet, another outlet 14 is an IEC 60320 C19-type outlet, and other outlets 12 are IEC 60320 C13-type outlets. It is contemplated that, in other embodiments, still other types of outlets may alternatively or additionally be used in the power distribution unit 10. Furthermore, the power distribution unit 10 may utilize interchangeable outlet adapters as described in co-pending, commonly-assigned U.S. non-provisional patent application Ser. No. 13/751,118.

As shown in FIGS. 2-4, the cable retention system 40 includes one or more tethers 30 and one or more tether mounts 20. In this regard, FIG. 3 is a front isometric view of a tether 30 of the cable retention system 40 of FIG. 2, and FIG. 4 is a rear isometric view of a tether mount 20 of the cable retention system 40 of FIG. 2. The tether 30 may be composed of a wide range of different materials. In a preferred embodiment, the tether 30 is composed of a plastic material, which may have flexible qualities.

As perhaps best shown in FIG. 3, the tether 30 includes an elongate portion 42 having an attachment portion 38 at a proximate end thereof. The elongate portion 42 includes a plurality of loops 34, each defining an aperture 36. In the specific embodiment depicted in FIG. 3, the loops 34 are bridge lances, and the apertures 36 are three-way apertures, but it will be appreciated that other configurations (some of which are shown and described elsewhere herein) are likewise possible. The apertures 36 may be used to tether power cables and cords 98 and their plugs in place, as described further hereinbelow.

The attachment portion 38 of the tether 30 facilitates attachment of the tether 30 to any of the tether mounts 20. As shown in FIG. 4 in particular, the tether mount 20 includes a head 26 that is attached to a base 22 via a shaft 24. The base 22 of the tether mount 20 attaches directly to a cover plate or other portion of the power distribution unit 10. The head 26 is configured as a knob or boss that is disposed away from the cover plate of the power distribution unit 10 by a distance determined by the length of the shaft 22. In the exemplary PDU 10 shown in FIG. 2, six tether mounts 20 have been provided, and a tether 30 may be mounted as described below on any or all of them; however, for clarity, only a single tether 30 is shown mounted in FIG. 2.

FIG. 5 is a rear perspective view of the tether 30 of FIG. 3. As shown in FIG. 5, the attachment portion 38 of the tether 30 includes a channel 32 therein, which is shaped to accommodate the head 26 of the tether mount 20. The channel 32 is shown as being open to one side and closed at the opposite side, thus allowing the channel 32 to nearly surround the head 26 of the tether mount 20. To secure the tether 30 to the tether mount 20, the channel 32 is aligned with the head 26 of the tether mount 20. The head 26 may then be snap-fitted into the channel 32 such that the tether 30 and tether mount 20 are snapped securely together. The tether 30 may likewise be snapped off of the tether mount 20 in the event that the tether 30 needs to be moved, shifted or otherwise reconfigured. In this regard, the cable retention system 40 of the present invention provides enhanced flexibility by permitting individual tethers 30 to be removed and re-secured as needed. Furthermore, the cable retention system 40 of the present invention facilitates tool-less cord retention at a power distribution unit 10.

Figure 6:
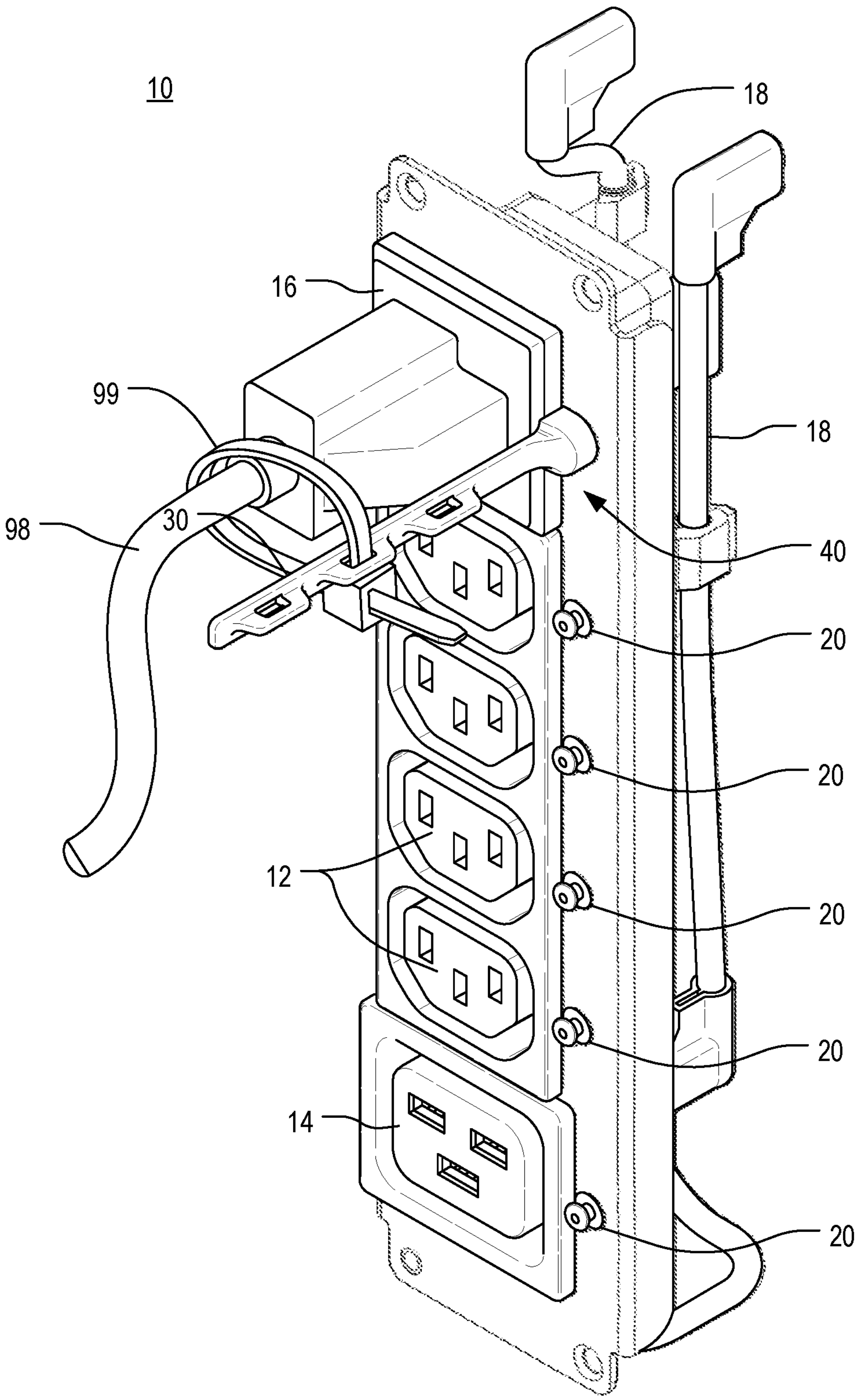
FIG. 6 is a front isometric view of the power distribution unit (PDU) of FIG. 2, shown in use.

The loops 34 and apertures 36 may be used to secure the plugs of various cables or cords 98 to their corresponding outlets 12,14,16. In this regard, FIG. 6 is a front isometric view of the power distribution unit (PDU) 10 of FIG. 2, shown in use. In particular, the plug of a power cable 98 is held in place in its “plugged in” state by a conventional tie wrap 99 that is wrapped around the power cable 98, near the plug, and through the middle aperture 36 of the tether 30 shown therein. In this way, the tether 30 helps to prevent accidental removal of an inlet receptacle (plug), plugged into one of the outlets 12,14,16, by inadvertent tugging or catching of the cable or cord 98.

In some embodiments, the three-way apertures 36 are not only able receive and retain a tie wrap 99, as shown in FIG. 6, but may receive and retain the end of a tether itself.

Figure 7:
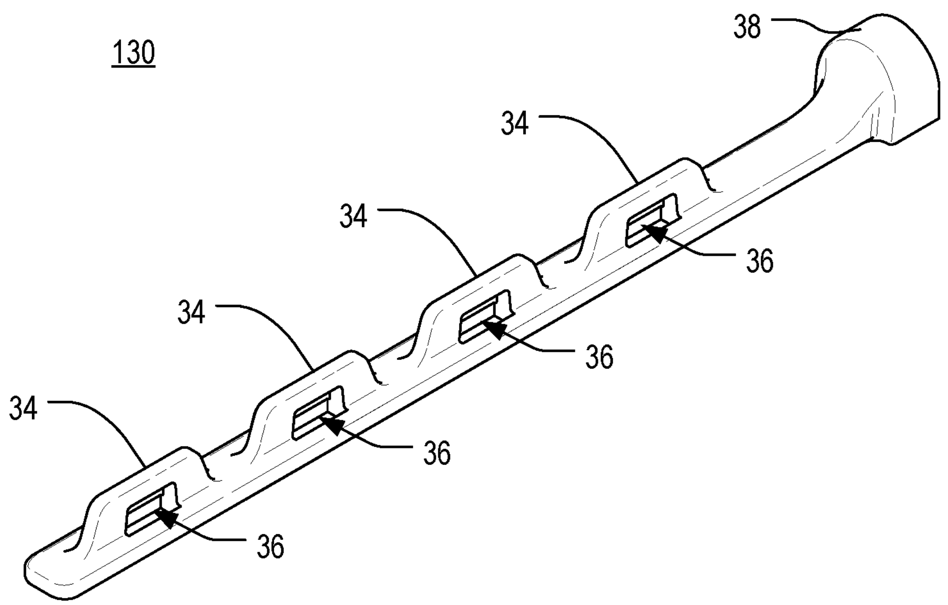
FIGS. 7-11 are each isometric views of alternative embodiments of a tether for use in a cable retention system in accordance with one or more preferred embodiments of the present invention.

FIG. 7 is a front isometric view of an alternative tether 130 for use in a cable retention system in accordance with one or more preferred embodiments of the present invention. While it is contemplated that the elongate portion 42 may have any desired number of loops 34, three loops 34 are shown in the embodiment of FIG. 3. By contrast, in the embodiment of FIG. 7, the tether 130 includes four bridge lances 34, each defining an aperture 36 for accommodating tie wraps 99 and the like.

Figure 8:
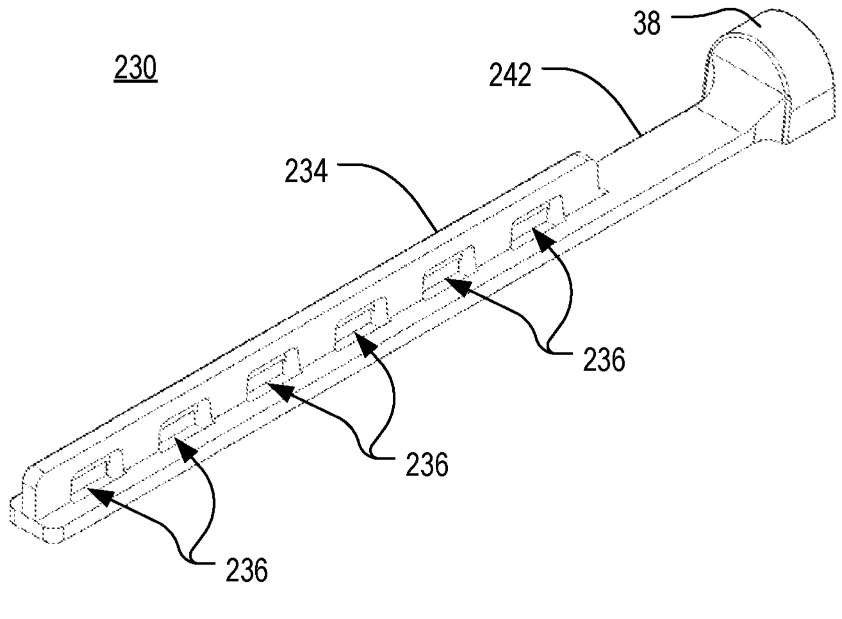

FIG. 8 is a front isometric view of another alternative tether 230 for use in a cable retention system in accordance with one or more preferred embodiments of the present invention. In the embodiment of FIG. 8, the tether 230 includes a single ridge 234, extending above one side of an elongate portion 242, that defines a plurality of three-way apertures 236 for accommodating tie wraps 99 and the like.

Figure 9:
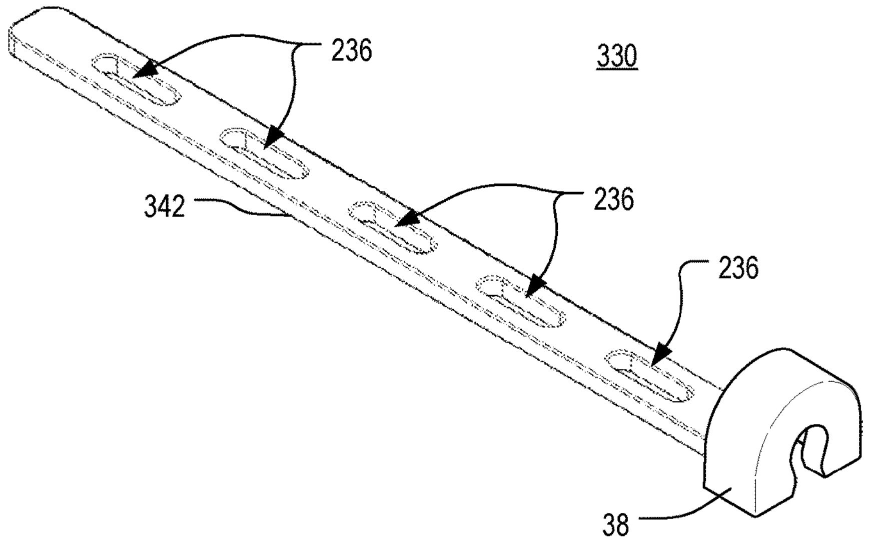

FIG. 9 is a front isometric view of another alternative tether 330 for use in a cable retention system in accordance with one or more preferred embodiments of the present invention. In the embodiment of FIG. 9, the tether 330 includes an elongate portion 342 that whose main body defines a plurality of apertures 336 for accommodating tie wraps 99 and the like.

Figure 10:
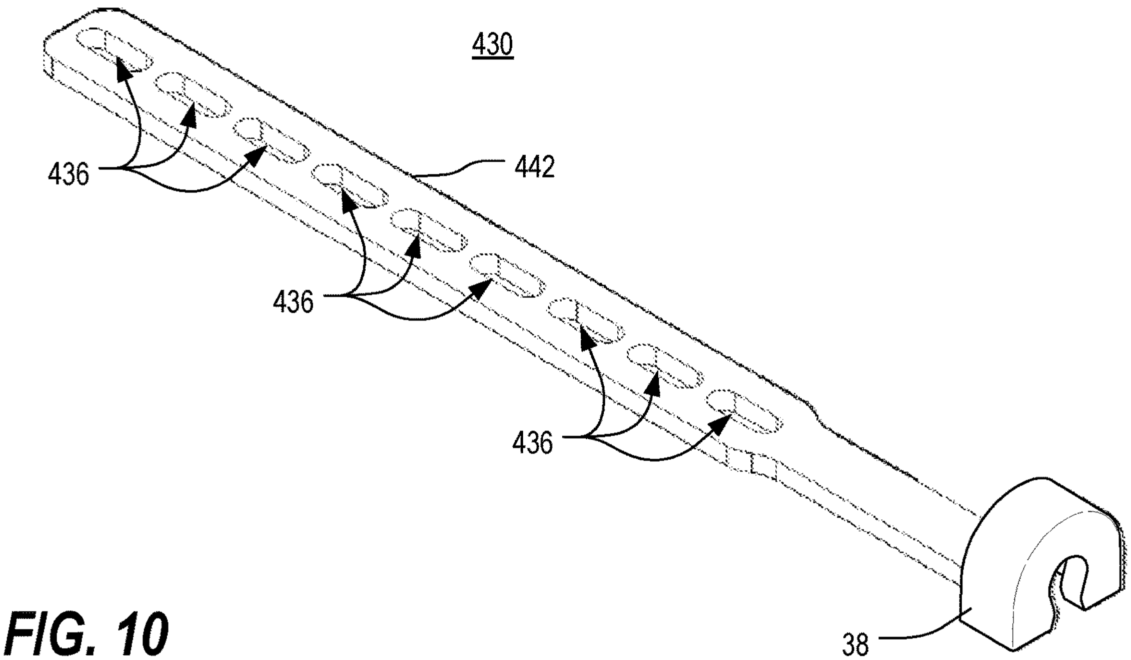

FIG. 10 is a front isometric view of another alternative tether 430 for use in a cable retention system in accordance with one or more preferred embodiments of the present invention. In the embodiment of FIG. 10, the tether 430 includes an elongate portion 442 whose flared main body defines a plurality of apertures 436 for accommodating tie wraps 99 and the like.

Figure 11:
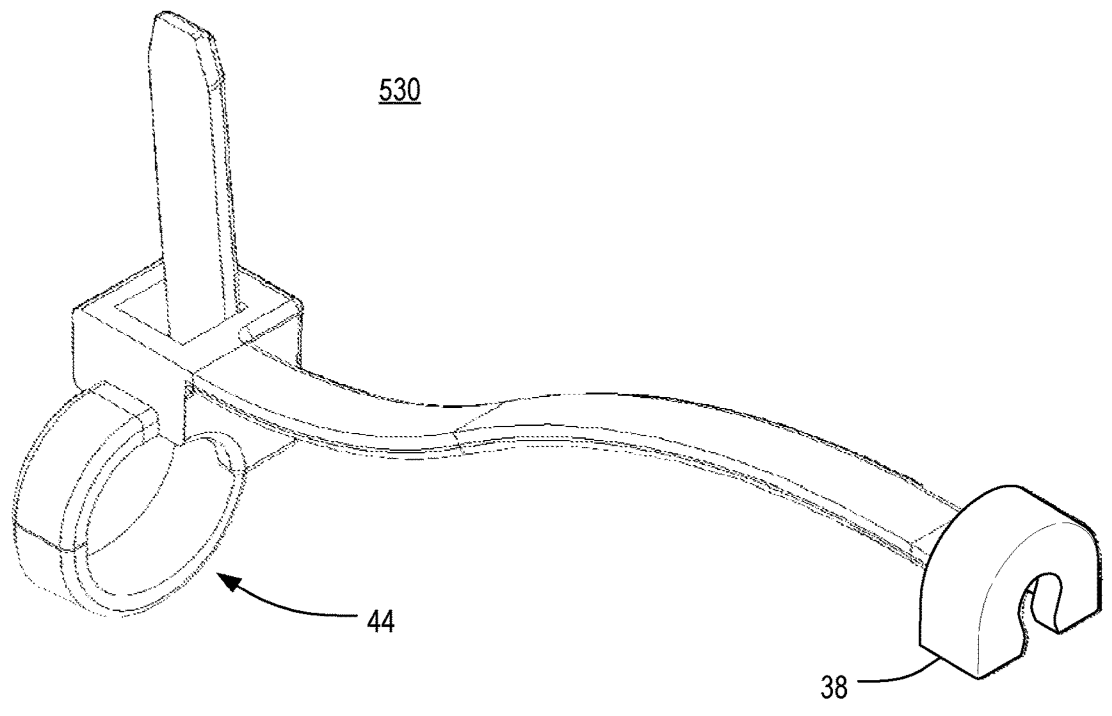

FIG. 11 is a front isometric view of another alternative tether 530 for use in a cable retention system in accordance with one or more preferred embodiments of the present invention. In the embodiment of FIG. 11, the tether 530 may itself include an integrated tie wrap 44 at an end thereof for cable retention.

In still other alternative embodiments of the present invention, other structures, such as accessories and the like for electronic equipment enclosures, may be secured using the principles of the present invention. In particular, it is contemplated that various accessories may be snap-fitted to a mount in a manner similar to that of the tether 30 snap-fitting to the tether mount 20. In this regard, accessories may be snapped securely to a corresponding mount, and may be removed and re-secured with relative ease. It is further contemplated that accessories may include multiple channels for securement to multiple mounts. Additionally, it is contemplated that an accessory secured using the principles of the present invention may have hinging capabilities around the mount to which it is secured.

Figure 12:
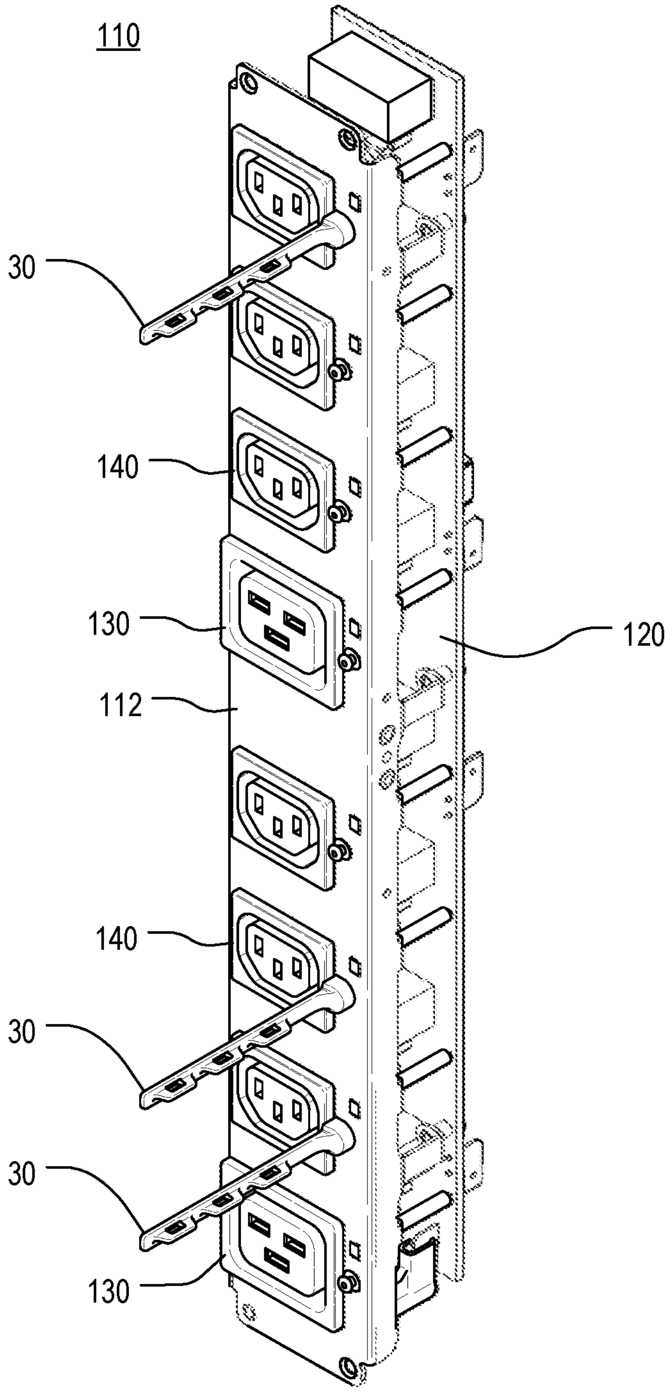
FIG. 12 is a front isometric view of another exemplary power distribution unit of FIG. 1 using a cable retention system in accordance with one or more preferred embodiments of the present invention.

FIG. 12 is a front isometric view of another exemplary power distribution unit 110 of FIG. 1 using a cable retention system in accordance with one or more preferred embodiments of the present invention. The elements of the cable retention system, a plurality of tether mounts 20 and a plurality of tethers 30, are similar to those of the cable retention system 40 of FIG. 2. The power distribution unit 110 itself includes a cover plate 112, a printed circuit board (PCB) 120 and a plurality of receptacles or outlet adapters 130,140. In particular, the power distribution unit 110 is configured to accommodate a plurality of separate outlet adapters 130,140, which may be of different types. For example, in the particular embodiment depicted in FIG. 12, the power distribution unit 110 includes two C19-type outlet adapters 130 and six C13-type outlet adapters 140.

In particular, the C13-type outlet adapter 140 includes a user-facing C13-type connector and a PCB-facing inlet having male terminals that extend from the rear of the adapter 140 for pairing with a female terminal set on the printed circuit board 120. Similarly, the C19-type outlet adapter 130 includes a user-facing C19-type connector and a PCB-facing inlet having male terminals that extend from the rear of the adapter 140 for pairing with a female terminal set on the printed circuit board 120. Notably, in contrast to conventional couplers, the different outlet adapters 130,140 utilize inlet configurations having a common footprint. By way of explanation, a user-facing C19-type outlet is conventionally paired with a PCB-facing C20-type connector to form a C19/C20 coupler, while a user-facing C13-type outlet is conventionally paired with a PCB-facing C14-type connector to form a C13/C14 coupler. C19/C20 couplers and C13/C14 couplers are not interchangeable, however, because C20-type connectors and C14-type connectors have different footprints, and thus require different terminal sets to be provided on the printed circuit board 120. In the present invention, however, each user-facing outlet, regardless of type (C13, C19, etc.) is paired with a PCB-facing connector that utilizes a single, standardized footprint, and the resulting outlet adapter may thus be connected to any terminal set on the PCB 120. In particular, in the illustrated embodiments, the C19-type outlet adapter 130 and the C13-type outlet adapter 140 each utilize an inlet connector having the footprint of a conventional C20-type inlet connector, and the female terminal sets are arranged to receive any set of male terminals having this footprint. In other words, rather than use a C14-type inlet connector, as would be typical with a conventional C13-type outlet adapter, the C13-type outlet adapter 140 shown herein utilizes the same inlet connector footprint as that of the C19-type outlet adapter 130. With matching terminal patterns, it is possible to interchange or exchange different types of outlet adapters 130,140 within the same power distribution unit 110. Because the two different types of outlet adapters 130,140 share a common inlet footprint (which may be the footprint of a C20-type inlet connector), the two types are interchangeable.

Different configurations of outlet adapters 130,140 within the power distribution unit 110 may even be implemented in the field, long after initial assembly. This could be accomplished by removing the cover plate 112, adding, removing, or swapping the desired outlet adapters (including the outlet adapters 130,140 illustrated herein), and replacing the cover plate with 112 a new cover plate that is configured to accommodate the chosen arrangement of outlet adapters. The PCB 120, and all the connections thereto, could remain in place the entire time. Such power distribution units 110 and their use are described in co-pending, commonly-assigned U.S. non-provisional patent application Ser. No. 13/751,118.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. A cable retention system for a power distribution unit, the cable retention system comprising:

a tether mount having a base at a proximal end, a boss at a distal end and a shaft that connects the boss to the base; and an elongate tether removably mounted on the boss of the tether mount, the elongate tether having an attachment portion disposed at an end thereof;

wherein the attachment portion of the elongate tether includes a channel shaped to receive the boss of the tether mount and at least a portion of the shaft; and wherein at least a portion of a mouth of the channel is narrower than an interior of the channel such that at least one of the boss or the portion of the shaft is received within the channel via snap-fit.

2. The cable retention system of claim 1, wherein the elongate tether is formed of a flexible material to impart the elongate tether with a pliable quality.

3. The cable retention system of claim 1, wherein the elongate tether defines at least one aperture for receiving a tie wrap.

4. The cable retention system of claim 3, wherein the at least one aperture is a plurality of apertures.

5. The cable retention system of claim 1, wherein the elongate tether includes at least one bridge lance that defines an aperture for receiving a tie wrap.

6. The cable retention system of claim 1, wherein the elongate tether includes a ridge extending along one side thereof that defines at least one aperture for receiving a tie wrap.

7. The cable retention system of claim 1, wherein the elongate tether includes an integrated tie wrap.

8. A cable retention system comprising:

a power distribution unit;

a plurality of tether mounts, each having a base at a proximal end, a boss at a distal end and a shaft that connects the boss to the base, the base of each of the plurality of tether mounts being secured to the power distribution unit; and at least one elongate tether removably mounted on the power distribution unit via a selected one of the plurality of tether mounts;

wherein the at least one elongate tether includes an attachment portion disposed at an end thereof, the attachment portion including a channel shaped to receive, via snap-fit, the boss of the selected tether mount and at least a portion of the shaft thereof; and wherein the at least one elongate tether is interchangeably attachable, via snap-fit, at any of the other of the plurality of tether mounts.

9. The cable retention system of claim 8, wherein the elongate tether is formed of a flexible material to impart the elongate tether with a pliable quality.

10. The cable retention system of claim 8, wherein the elongate tether defines at least one aperture for receiving a tie wrap.

11. The cable retention system of claim 8, wherein the elongate tether includes at least one bridge lance that defines an aperture for receiving a tie wrap.

12. The cable retention system of claim 8, wherein the elongate tether includes a ridge extending along one side thereof that defines at least one aperture for receiving a tie wrap.

13. The cable retention system of claim 8, wherein the elongate tether includes an integrated tie wrap.

* * * * *